(12) United States Patent
Hsieh et al.

(10) Patent No.: US 7,917,832 B2
(45) Date of Patent: Mar. 29, 2011

(54) APPARATUS FOR IMPROVING DATA ACCESS RELIABILITY OF FLASH MEMORY

(75) Inventors: Jen-Wei Hsieh, Taipei (TW); Tei-Wei Kuo, Taipei (TW); Hsiang-Chi Hsieh, Sindian (TW)

(73) Assignee: Genesys Logic, Inc., Taipei (TW)

( * ) Notice: Subject to any disclaimer, the term of this patent is extended or adjusted under 35 U.S.C. 154(b) by 991 days.

(21) Appl. No.: 11/798,198

(22) Filed: May 11, 2007

(65) Prior Publication Data
US 2007/0266298 A1 Nov. 15, 2007

(30) Foreign Application Priority Data
Apr. 26, 2006 (TW) ................................ 95207099 U

(51) Int. Cl.
*G11C 21/00* (2006.01)
(52) U.S. Cl. .................... 714/765; 714/781; 365/185.09
(58) Field of Classification Search .................. 714/781, 714/763; 365/185.09
See application file for complete search history.

(56) References Cited

U.S. PATENT DOCUMENTS

| | | | | |
|---|---|---|---|---|
| 6,058,047 A * | 5/2000 | Kikuchi | .................... | 365/185.33 |
| 6,711,059 B2 * | 3/2004 | Sinclair et al. | ........... | 365/185.11 |
| 6,725,321 B1 * | 4/2004 | Sinclair et al. | ................ | 711/103 |
| 7,305,596 B2 * | 12/2007 | Noda et al. | ..................... | 714/718 |
| 7,444,579 B2 * | 10/2008 | Radke et al. | .................. | 714/763 |
| 7,646,667 B2 * | 1/2010 | Conley et al. | ........... | 365/230.06 |
| 7,657,692 B2 * | 2/2010 | Lee et al. | ....................... | 710/315 |
| 7,660,938 B1 * | 2/2010 | Chow et al. | ................... | 710/313 |
| 2003/0110361 A1 * | 6/2003 | Kanehira et al. | .............. | 711/154 |
| 2005/0041553 A1 * | 2/2005 | Aizawa | ...................... | 369/59.17 |

* cited by examiner

Primary Examiner — Esaw T Abraham

(57) ABSTRACT

An apparatus for improving the data access reliability of flash memory is provided, including an instruction register, an address register, a flash memory control circuit, a data register, an encoder, an error correction code (ECC) generator, a signal converter, a comparator, an arbitrator, and a decoder. The instruction register and the address register are connected to a flash memory respectively for storing the access instructions and the addresses. The flash memory control circuit is connected to both instruction register and address register for controlling the access to the flash memory. The data register is connected to flash memory control circuit for loading data to be written to the flash memory. The encoder encodes the written data, and the ECC generator generates an ECC, which is written to the flash memory through the signal converter. The comparator and the arbitrator provide the comparison with ECC and informing decoder f suspicious bit values when data is read from the flash memory. The decoder is for correctly decoding data and avoiding the suspicious bit values to be read. Thus, the object improving the data access reliability of flash memory is achieved.

3 Claims, 3 Drawing Sheets

APPARATUS FOR IMPROVING DATA ACCESS RELIABILITY OF FLASH MEMORY

BACKGROUND OF THE INVENTION

1. Field of the Invention

The present invention relates to an apparatus for improving data access reliability of flash memories and, more particularly, to an apparatus applicable to flash memories for improving data access reliability by hardware encoding, comparison, arbitration and decoding.

2. The Related Arts

Flash memory is widely used in computer and consumer electronic digital equipments, such as flash memory pen, MP3 player. However, the current technology for access control for the flash memory allows about 1,000,000 erases to a flash memory area. Beyond the limit, the data stored in that flash memory area may not be able to read. When an area in the flash memory cannot be read because it exceeds the erase limit, often referred as tolerance, it is sometimes referred as penetrated.

Because of the above constrain on the lifespan of the flash memory, it is an important issue to assure that the penetrated flash memory can still be read. The conventional approaches to this problem are either to improve the hardware technology, namely raising the tolerance, or to use the error correction code (ECC) to correct the errors. The capability of ECC approach is constrained by the flash memory page size and the spare area size. For example, to detect two-bit error, and correct one-bit error for a 512-byte page, it requires 24 bits of ECC.

FIG. 1 of the attached drawings shows a schematic view of a conventional structure of flash memory data access. To write data A1 into a data area A2, the access control also generates an ECC A3 to be stored in the reserved area A4 after the data area A2. When this type of data access structure is applied in the even more unreliable multi-level cell (MLC) flash memory, the problem is even more severe. This is because a cell of an MLC flash memory stores two or more bits; and therefore, the value of the bit can be erroneously determined. Although increasing the size of reserved area to provide more storage space for ECC can slightly alleviate the problem, this approach must change the entire system and hardware design of the current flash memory, which is not economically viable.

In addition, Taiwan Patent Publication No. 575806 disclosed a method for enhancing the ECC capability of flash memory and encrypting data. However, the disclosed method is not applicable to the two-bit error correction capability, and may lead to erroneous data determination.

SUMMARY OF THE INVENTION

An object of the present invention is to provide an apparatus for improving data access reliability of flash memory. Through encoding the written data by an encoder and performing error correction computation on the encoded data by an error code generator, the apparatus improves the decoding efficiency as to be applied to the situation in which the data access to flash memory must meet the requirements of two-bit error detection and one-bit error correction.

Another object of the present invention is to provide an apparatus for improving data access reliability of flash memory through a comparator, an arbitrator and a decoder. The result from the comparison with the ECC in the reserved area by the comparator is used to select the decoder cells. The arbitrator informs the decoder of the suspicious bits. When the decoder selects the cells to recover the original data, the decoder tries to avoid the suspicious cells as to improve the decoding efficiency. When applied in MLC flash memory, the apparatus enables the correct judgment of the bit value and storage to improve the data access reliability.

A further object of the present invention is to provide an apparatus for improving the data access reliability of flash memory through an arbitrator which can further differentiate voltage level in MLC flash memory application. When storing data in the two-bit MLC flash memory, it is necessary to differentiate four voltage levels, represented by 11, 10, 01, 00, to eliminate the bit value mis-judgment. The arbitrator informs the decoder of the suspicious bit value, the decoder can try to avoid the suspicious cells when selecting cells to recover the original data.

To achieve the aforementioned objects, the present invention provides an apparatus for improving the data access reliability of flash memory, comprising an instruction register, an address register, a flash memory control circuit, a data register, an encoder, an error correction code (ECC) generator, a signal converter, a comparator, an arbitrator, and a decoder. The instruction register and the address register are connected to a flash memory respectively for storing the access instructions and the addresses. The flash memory control circuit is connected to both instruction register and address register for controlling the access to the flash memory. The data register is connected to flash memory control circuit for loading data to be written to the flash memory. The encoder encodes the written data, and the ECC generator generates an ECC, which is written to the flash memory through the signal converter. The comparator and the arbitrator provide the comparison with ECC and informing decoder f suspicious bit values when data is read from the flash memory. The decoder is for correctly decoding data and avoiding the suspicious bit values to be read. Thus, the object improving the data access reliability of flash memory is achieved.

These and other objects, features and advantages of the invention will be apparent to those skilled in the art, from a reading of the following brief description of the drawings, the detailed description of the preferred embodiment, and the appended claims.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENT

Figure 1:
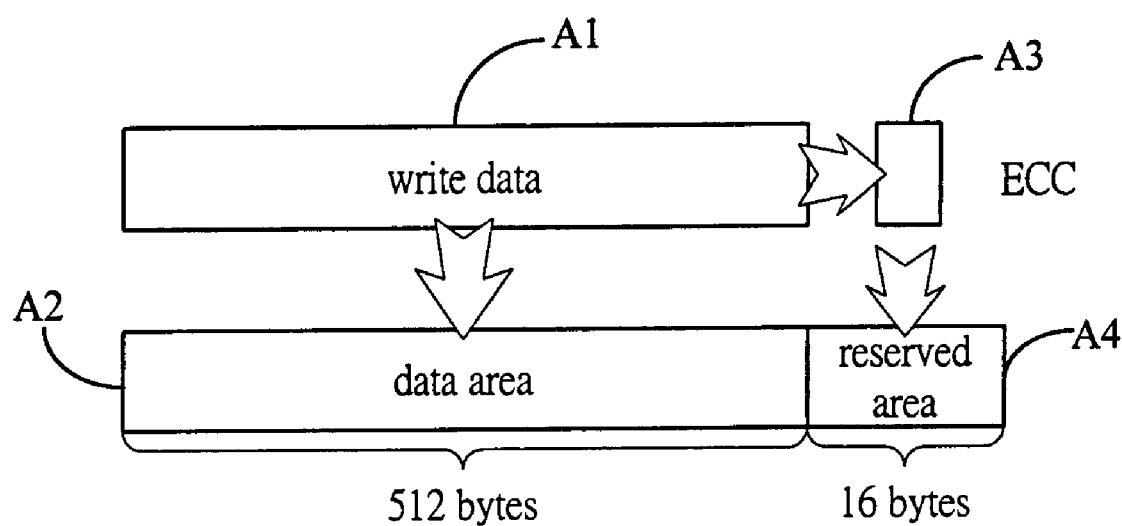
FIG. 1 shows a schematic view of the error code generation and storage structure of a conventional flash memory.
Figure 2:
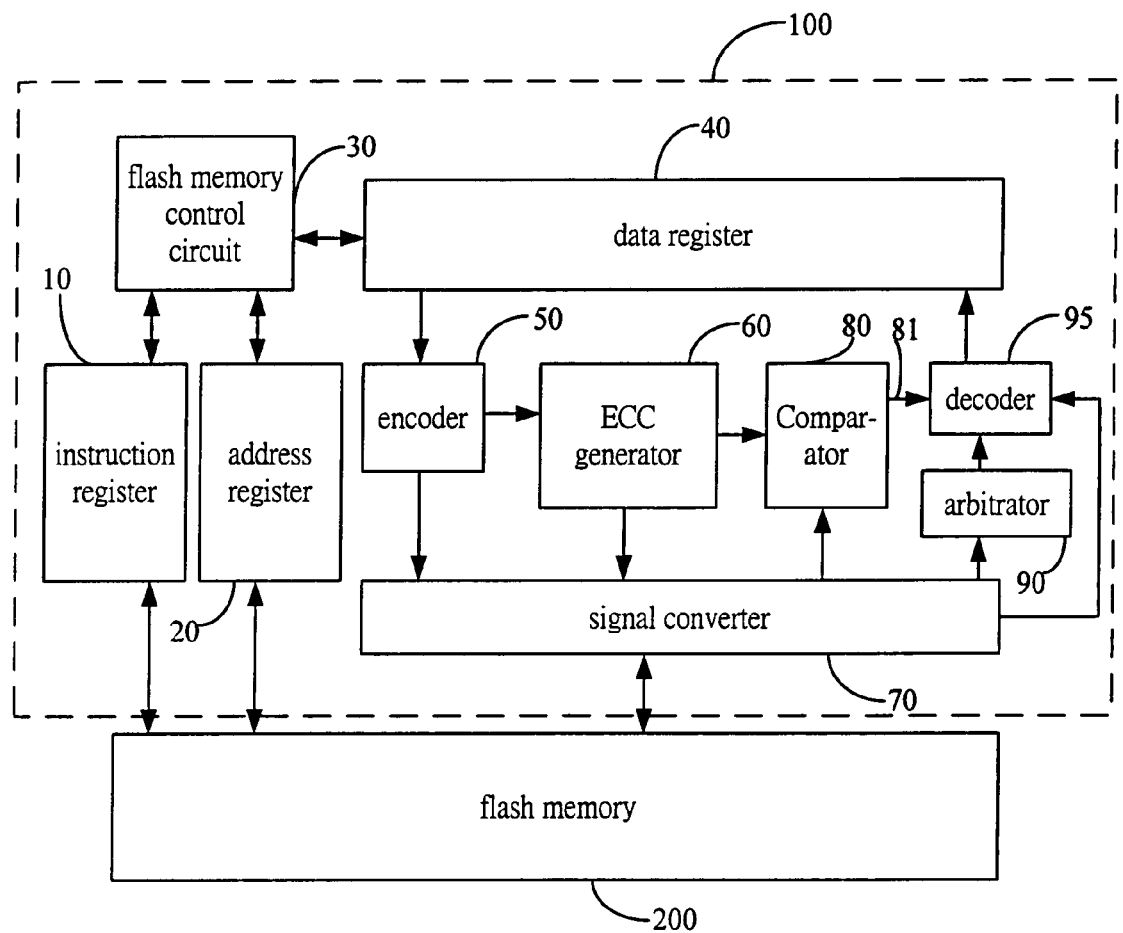
FIG. 2 shows a block diagram of an apparatus for improving the data access reliability of flash memory of according the present invention.

With reference to the drawings and in particular to FIG. 2, which shows an apparatus constructed in accordance with the present invention for improving data access reliability of a flash memory, generally designated with reference numeral 100, the apparatus 100 comprises an instruction register 10, an address register 20, a flash memory control circuit 30, a data register 40, an encoder 50, an ECC generator 60, a signal converter 70, a comparator 80, an arbitrator 90 and an decoder 95. The instruction register 10 and the address register 20 are connected to a flash memory 200. The instruction register 10 stores the access instructions to the flash memory 200, and identifies whether the instruction is read instruction or write instruction. The address register 20 stores the target address for access to the flash memory 200.

The flash memory control circuit 30 is connected to the instruction register 10 and the address register 20 for controlling read or write access to the flash memory 200 according to the contents of the instruction register 10 and the address register 20. The date register 40 is connected to the flash memory 200 for storing the data read from or written into the flash memory 200.

The encoder 50 is connected to the data register 40 for encoding the written data in the data register 40 and generate additional information for later error correction.

The ECC generator 60 is connected to the encoder 50 for performing ECC computation on the encoded data. The ECC code does not only for error correction but also for improving decoding efficiency.

The signal converter 70 is connected to the encoder 50, the ECC generator 60 and the flash memory 200 for converting the encoded data from the encoder 50 and ECC from the ECC generator 60, and then storing into the data area and reserved area in the flash memory 200.

The comparator 80 is connected to the ECC generator 60 and the signal converter 70 for comparing the ECC stored in the reserved area in the flash memory 200 and the ECC from the ECC generator 60 when the data is read from the flash memory 200. Based on the comparison result, the comparator 80 outputs a comparison control instruction 81 to assist in selecting the cells from the flash memory 200 for reading data.

Figure 3:
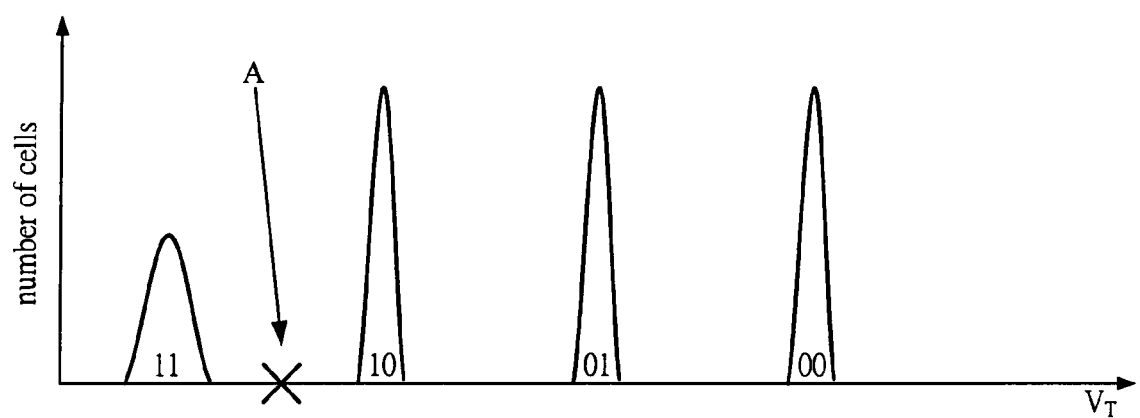
FIG. 3 shows a voltage logic diagram of the arbitrator selecting the suspicious cells according to the present invention.

Also referring to FIG. 3, the arbitrator 90 is connected to the signal converter 70 for further differentiating voltage levels in MLC application when reading data from the flash memory 200; for example, the four voltage levels can be identified as 11, 10, 01, and 00. Then, the arbitrator 90 picks out the suspicious bit value. For example, the x-axis in FIG. 3 is the logic voltage VT, and the y-axis is the number of cells. FIG. 3 shows a bit A has the value between 11 and 10, which is determined as suspicious, and outputted by the arbitrator 90.

The decoder 95 is connected to the comparator 80, the arbitrator 90 and the data register 40. The decoder 95 receives the comparison control instruction 81 from the comparator 80 and suspicious bits from the arbitrator 90. If the decoded data from the cells according to the information is correct, the decoded data is stored in the data register 40. Otherwise, another set of cells of the flash memory 200 are selected for decoding until the correct data is obtained or an iteration threshold is exceeded. By this, the data access reliability of the flash memory 200 is improved and suspicious cells are avoided to take erroneously read as correct.

While the invention has been described in connection with what is presently considered to the most practical and preferred embodiment, it is to be understood that the invention is not to be limited to the disclosed embodiment, but on the contrary, is intended to cover various modifications and equivalent arrangement included within the spirit and scope of the appended claims.

What is claimed is:

1. An apparatus for improving data access reliability of flash memory, the apparatus comprising:
    an instruction register, connected to a flash memory for storing read and write instruction to the flash memory;
    an address register, connected to the flash memory for storing target address of the read and write instruction;
    a flash memory control circuit, connected to the instruction register and the address register for controlling data reading and data writing to the flash memory according to contents stored in the instruction register and the address register;
    a data register, connected to the flash memory control circuit for storing data read from or written to the flash memory;
    an encoder, connected to the data register for encoding written data stored in the data register;
    an error correction code (ECC) generator, connected to the encoder for generating ECC for encoded data;
    a signal converter, connected to the encoder, the ECC generator and the flash memory for converting the encoded data from the encoder and the ECC from the ECC generator and storing into a reserved area of the flash memory;
    a comparator, connected to the ECC generator and signal converter for comparing ECC from the ECC generator and ECC stored in the reserved area during reading data, and outputting a comparison control instruction based on the comparison result;
    an arbitrator, connected to the signal converter for further differentiating voltage levels and outputting suspicious bit values; and
    a decoder, connected to the signal converter, the comparator, and the arbitrator for selecting cells form the flash memory to decode and outputting decoded data into the data register.

2. The apparatus as claimed in claim 1, wherein the flash memory connected to the instruction register and the address register is a multi-level cell flash (MLC) memory.

3. The apparatus as claimed in claim 1, wherein the arbitrator differentiates logic voltage into a plurality of voltage levels.

* * * * *